United States Patent
Guo et al.

(10) Patent No.: US 7,837,850 B2
(45) Date of Patent: Nov. 23, 2010

(54) ELECTROPLATING SYSTEMS AND METHODS

(75) Inventors: Ming-Da Guo, Tainan (TW); Pin-Chieh Hu, Tainan (TW); Hung-Cheng Chen, Taipen (TW); Kuan-Hsiao Lin, Daliao Township, Kaohsiung County (TW); Wen-Chang Peng, Tainan (TW); Hsiao-Pin Shih, Kaohsiung (TW); Chyi-Shyuan Chern, Taipei (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 1456 days.

(21) Appl. No.: 11/237,493

(22) Filed: Sep. 28, 2005

(65) Prior Publication Data

US 2007/0068818 A1    Mar. 29, 2007

(51) Int. Cl.
  *C25D 21/12*  (2006.01)
(52) U.S. Cl. .......................................... 205/82; 204/194
(58) Field of Classification Search ............... 205/82
  See application file for complete search history.

(56) References Cited

U.S. PATENT DOCUMENTS

| | | | | |
|---|---|---|---|---|
| 1,494,152 A | * | 5/1924 | Cowper-Coles | 205/73 |
| 5,476,578 A | * | 12/1995 | Forand et al. | 204/207 |
| 5,653,860 A | * | 8/1997 | Nicholls et al. | 205/80 |
| 6,231,743 B1 | * | 5/2001 | Etherington | 205/83 |
| 6,368,482 B1 | * | 4/2002 | Oeftering et al. | 205/91 |
| 6,409,903 B1 | | 6/2002 | Chung et al. | |
| 6,773,577 B1 | * | 8/2004 | Broy et al. | 205/775 |
| 2004/0124089 A1 | * | 7/2004 | Basol | 205/137 |

FOREIGN PATENT DOCUMENTS

| | | |
|---|---|---|
| TW | 526294 | 4/2003 |
| TW | 200300376 | 6/2003 |
| WO | WO 03042433 A1 * | 5/2003 |

* cited by examiner

*Primary Examiner*—Harry D Wilkins, III
*Assistant Examiner*—Bryan D. Ripa
(74) *Attorney, Agent, or Firm*—Thomas, Kayden, Horstemeyer & Risley

(57) ABSTRACT

An electroplating system is provided. The system comprises a reaction tank, a tube, and a video bubble detector. The reaction tank, having a first diameter, contains a plating solution. The tube, connecting to the reaction tank, comprises an inflow tube and a branch, wherein the inflow tube inputs the plating solution into the reaction tank, and the branch has an enlarged part having the first diameter. The video bubble detector, mounted on the enlarged part of the branch, detects the presence of a bubble in the plating solution flowing through the branch.

11 Claims, 3 Drawing Sheets

ELECTROPLATING SYSTEMS AND METHODS

The present invention relates generally to electroplating, in particular, to bubble detection during an electroplating process.

Electroplating processes, such as copper electroplating processes, have been used in the semiconductor industry to fill structures such as dual damascene trenches and contact holes. Defects may be formed in a semiconductor device if bubbles exist in the plating solution during an electroplating process. Additionally, it may be difficult for bubbles generated during plating to be released from the high aspect ratio structures.

Air may be introduced into an electroplating solution when a pump circulating the electroplating solution is unstable. The introduced air forms bubbles in the electroplating solution. The bubbles are small when the electroplating solution flows through an inflow tube due to high pressure in the inflow tube. The bubbles dilate when the electroplating solution flowing in an electroplating tank due to a decreased pressure thereof. The dilated bubbles cause problems in an electroplating process. Conventionally, bubbles present in the electroplating tank are visually detectable. The conventional visual detection method is error prone.

Hence, there is a need for a system that addresses problems arising from the existing technology.

SUMMARY

An electroplating system is provided. The system comprises a reaction tank, a tube, and a video bubble detector. The reaction tank, having a first diameter, comprises a plating solution. The tube, connected to the reaction tank, comprises an inflow tube and a branch, wherein the inflow tube inputs the plating solution into the reaction tank, and the branch has an enlarged part having the first diameter. The video bubble detector, mounted on the enlarged part of the branch, detects a bubble existing in the plating solution flowing through the branch.

Also disclosed is an electroplating system. The system comprises a reaction tank and a video bubble detector. The reaction tank, having a first diameter, comprises a plating solution. The video bubble detector, mounted on a sidewall of the reaction tank, detects bubbles existing in the plating solution.

Also disclosed is an electroplating method. A reaction tank is provided, wherein the reaction tank has a first diameter and contains a plating solution. A tube comprises an inflow tube and a branch, wherein the inflow tube inputs the plating solution into the reaction tank, and the branch has an enlarged part having the first diameter. A video bubble detector is mounted on the enlarged part of the branch for detecting a bubble existing in the plating solution flowing through the branch.

Also provided is an electroplating method. A reaction tank is provided, wherein the reaction tank has a first diameter and contains a plating solution. A video bubble detector is mounted on a sidewall of the reaction tank for detecting a bubble existing in the plating solution.

A detailed description of the invention is given in the following with reference to the accompanying drawings.

BRIEF DESCRIPTION OF THE DRAWINGS

The invention can be more fully understood by reading the subsequent detailed description and examples with references made to the accompanying drawings, wherein.

DETAILED DESCRIPTION

The invention will now be described with reference to FIGS. 1 through 3, which generally relate to an electroplating system.

In the following detailed description, reference is made to the accompanying drawings which form a part hereof, and in which is shown by way of illustration of specific embodiments. These embodiments are described in sufficient detail to enable those skilled in the art to practice the invention, and it is to be understood that other embodiments may be utilized and that structural, logical and electrical changes may be made without departing from the spirit and scope of the present invention. The following detailed description is, therefore, not to be taken in a limiting sense. The leading digit(s) of reference numbers appearing in the figures corresponds to the figure number, with the exception that the same reference number is used throughout to refer to an identical component which appears in multiple figures.

Figure 1:
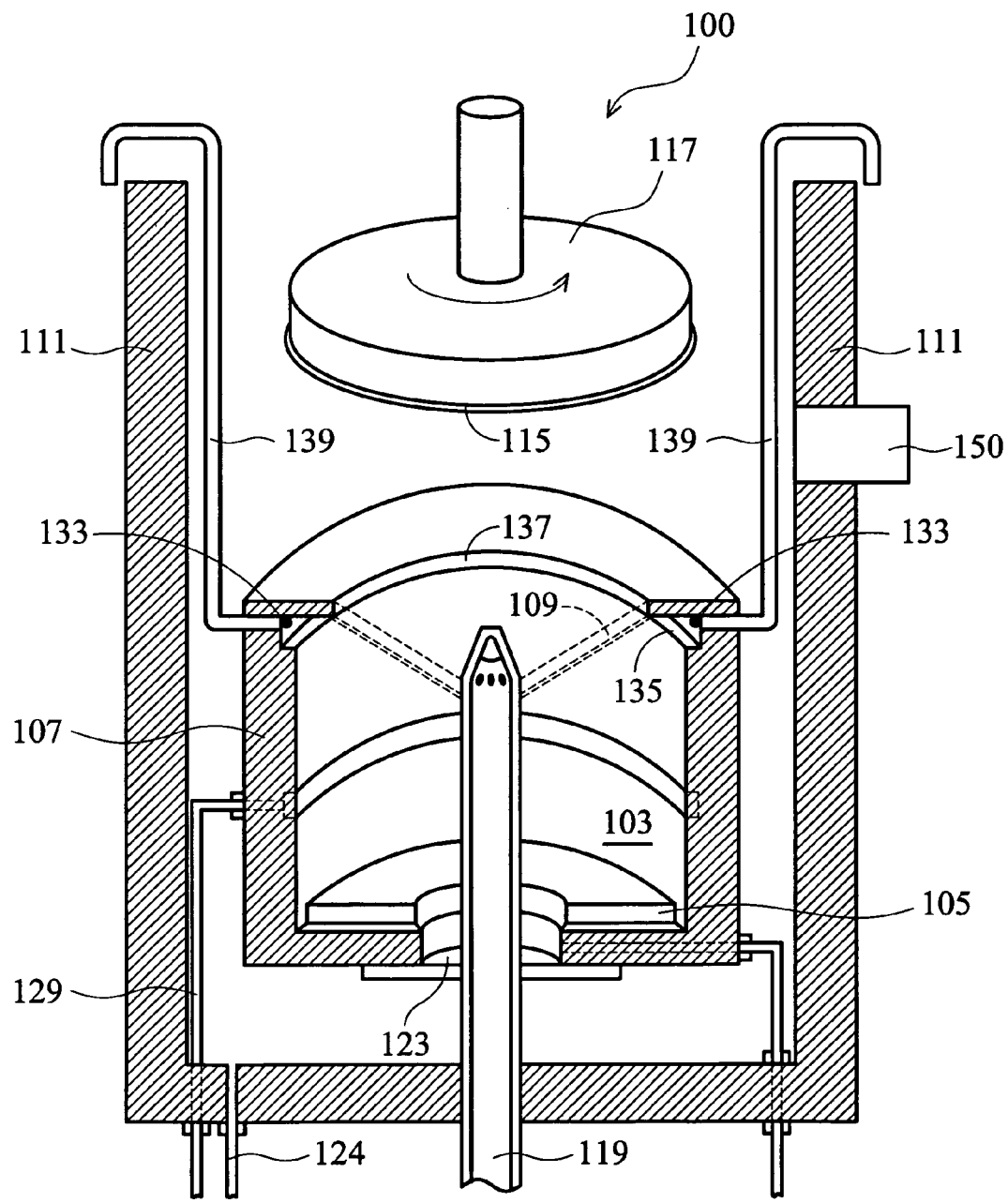
FIG. 1 is a schematic view of an embodiment of an electroplating system.

FIG. 1 is a schematic view of an embodiment of an electroplating system. FIG. 1 illustrates a cut-away view of an electroplating system 100 including a cylindrical anode chamber 103 and associated disk-shaped anode 105. Anolyte is held in anode chamber 103. Anode chamber 103 is defined by a rigid cylindrical frame 107 and a diffusion barrier membrane 109 attached to the top of frame 107. Membrane 109 is shaped as an inverted cone and serves as the ceiling of anode chamber 103.

A main chamber 111 of system 100 contains a catholyte (electroplating solution) in a cathode region 113 outside anode chamber 103. A cathode 115 (wafer or other substrate) is mounted on a rotatable cathode holder 117 allowing cathode 115 to rotate in the electroplating solution during electroplating. Electroplating solution is supplied to cathode region 113 by an inflow tube 119 passing through the center of anode chamber 103 and anode 105. The electroplating solution exits through a catholyte outlet 122 in chamber 111. The main chamber housing 111 is made from a rigid material that is resistant to chemical and electrochemical degradation from the electroplating solution.

As mentioned, anode chamber 103 includes a rigid cylindrical frame 107 and a conical porous diffusion membrane 109. An aperture 123 is located in the center bottom of inner frame 107, allowing inflow tube 119 to pass therethrough. Anolyte is supplied to an external compartment (e.g., an anolyte reservoir) or to an anolyte recirculation line via an anolyte outlet line 127.

Anolyte is supplied to chamber 103 from an external source (e.g., the anolyte reservoir) through an anolyte inlet line 129. Bubbles must be removed from anode chamber 103. If bubbles are not removed, they can interfere with the electroplating by displacing anolyte within chamber 103 and altering the electric field in the electrolyte. To address this concern, gas outlet ports 133 are provided around a groove 135 near the top of frame 107. The upper edge of groove 135 (and frame 107) is defined by a lip 137. Bubbles formed in anolyte chamber 103 rise therein and encounter membrane 109, which, due to the conical design, directs them toward lip 137. Bubbles accumulating on the underside of lip 137 enter gas outlet ports 133. From there, gas escapes the plating apparatus 100 via gas outlet tubes or "snorkels" 139 passing through catholyte in region 113.

Anolyte chamber frame 107 is made of a rigid material that resists chemical and electrochemical attack from the anolyte under operating conditions.

Transport barrier 109 is mounted to catholyte inlet line 119 and lip 137, on top of frame 107.

In order to detect whether bubbles are present in the electroplating solution, a video bubble detector 150 is mounted in a sidewall of main chamber 111. The video bubble detector 150 may be a charge coupled device (CCD) or other video detector.

Figure 2:
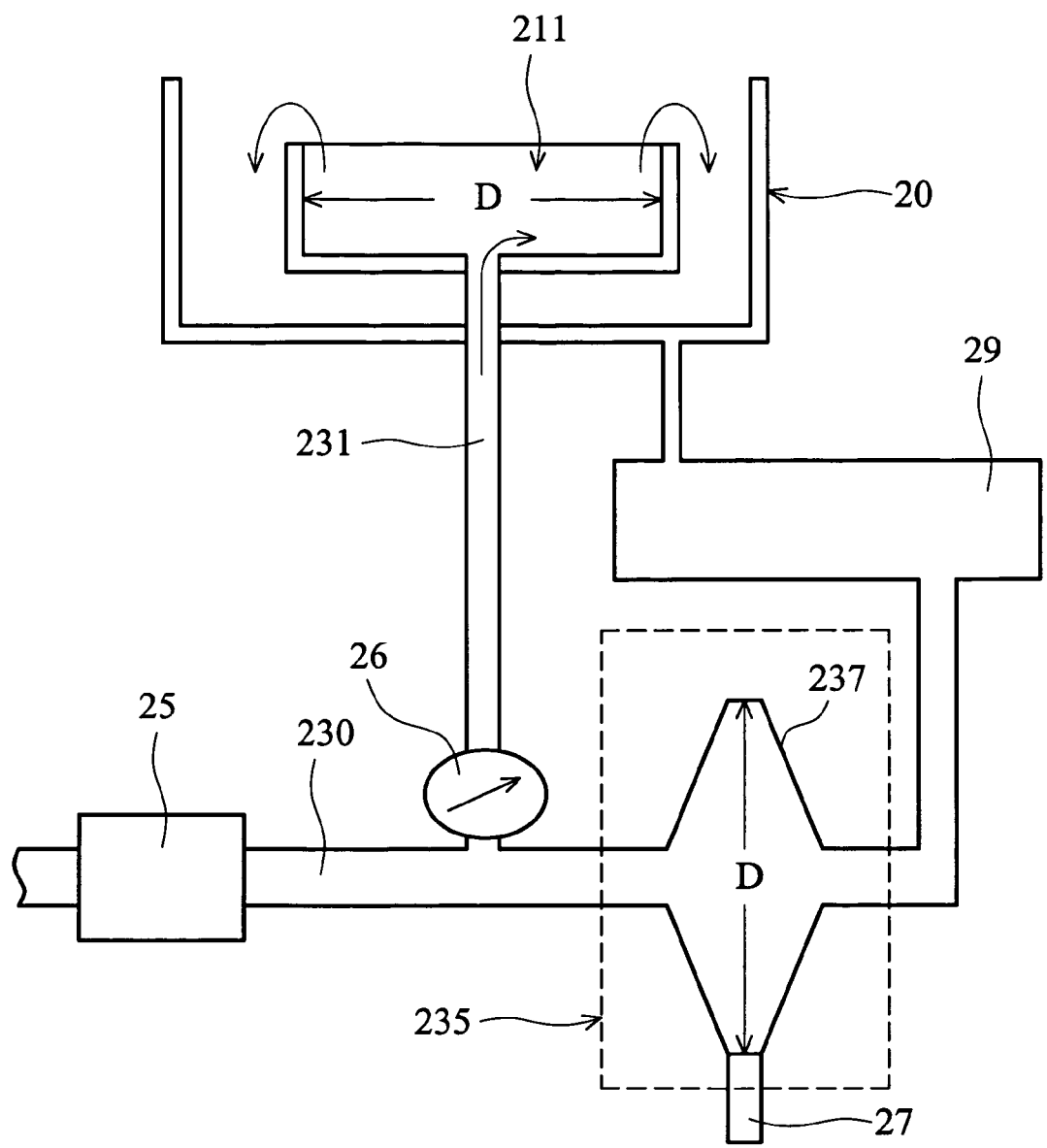
FIG. 2 illustrates a schematic view of another embodiment of an electroplating system.

FIG. 2 illustrates a schematic view of another embodiment of an electroplating system. A main chamber 211 is positioned within an overflow chamber 20. Tube 230 comprises an inflow tube 231 and a branch 235. The branch 235 comprises an enlarged part 237. Electroplating solution input to the tube flows into inflow tube 231 and branch 235, respectively. The flow of the electroplating solution is controlled by a controller 25, and a flow meter 26 is mounted on the inflow tube 231, thus the electroplating solution flowing into main chamber 211 is monitored by flow meter 26. The diameter of the main chamber 211, where an electroplating reaction takes place, is D. The enlarged part 237 has a diameter equal to D. A video bubble detector 27 is mounted on the enlarged part 237 for detecting whether a bubble is present in the electroplating solution contained in enlarged part 237. The video bubble detector 27 may be a charge coupled device (CCD) or other video detector. The electroplating solution overflowing from main chamber 211 and enlarged part 237 flows into a return tank 29.

In some embodiments, the anolyte includes one or more copper salts (e.g., copper sulfate) dissolved in water. It is substantially devoid of organic species, particularly accelerators. The electrolyte can also contain an acid. Typical formulations for the anolyte have between about 10 and 50 gm/l copper (as $Cu^{+2}$), and between about 0 and 200 gm/l $H_2SO_4$. More preferably, the anolyte concentration of copper is between about 15 and 40 gm/l and the concentration of acid is between about 0 and 180 gm/l $H_2SO_4$. Examples of two preferred formulations of electrolyte are (1) about 40 gm/l $Cu^{+2}$ and at most about 10 g/L $H_2SO_4$ (referred to as a low acid formulation) and (2) about 18 g/L $Cu^{+2}$ and about 180 g/L $H_2SO_4$ (referred to as a high acid formulation). Generally, the catholyte contains a substantially greater concentration of the non-ionic organic plating additives than the anolyte. The described anolyte and catholyte, or other composition in the electroplating bath is typically light sensitive. The light source used for the video bubble detector emits yellow, or light having a wavelength of about 570 nm.

Figure 3:
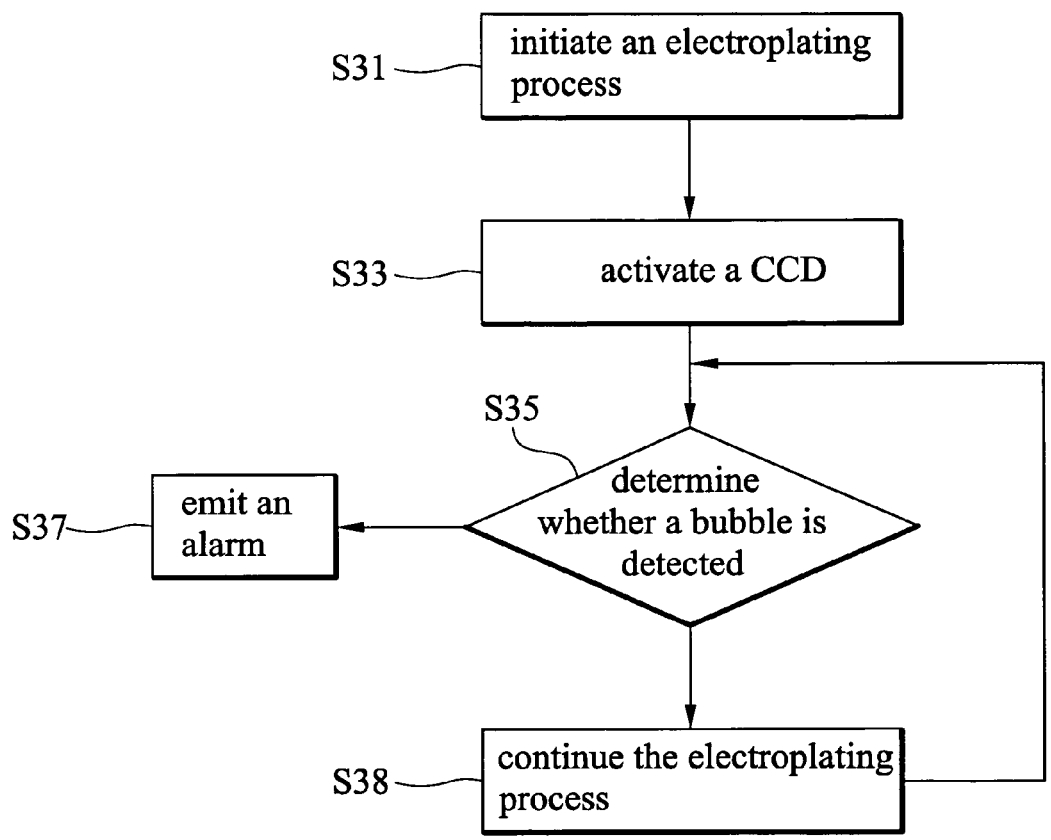
FIG. 3 illustrates a flowchart of an embodiment of a electroplating method.

FIG. 3 illustrates a flowchart of an embodiment of an electroplating method. The method can be implemented in the system illustrated in FIG. 1 or FIG. 2. In step S31, an electroplating process is initiated. In step S33, a CCD is activated to detect the presence of bubbles in the electroplating solution. In step S35, it is determined whether a bubble is detected, and if so, an alarm is triggered (step S37), otherwise the method proceeds to step S38. In step S38, the electroplating process is continued.

While the invention has been described by way of example and in terms of the preferred embodiments, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. An electroplating system, comprising:
   a reaction tank, having a first diameter, containing a plating solution;
   a tube, connected to the reaction tank, comprising an inflow tube and a branch, wherein the inflow tube inputs the plating solution into the reaction tank, and the branch has an enlarged part having the first diameter; and
   a video bubble detector, mounted on the enlarged part of the branch, detecting the presence of a bubble in the plating solution flowing through the branch.

2. The electroplating system of claim 1, further comprising a return tank receiving the plating solution overflowing from the reaction tank and returning from the branch.

3. The electroplating system of claim 1, wherein the video bubble detector comprises a charge coupled device (CCD).

4. The electroplating system of claim 1, wherein the reaction tank is used for a copper electroplating process of a semiconductor device.

5. The electroplating system of claim 4, wherein the video bubble detector employs a light source emitting a yellow light.

6. An electroplating method, comprising:
   providing a tube comprising an inflow tube and a branch, wherein the inflow tube inputs the plating solution into the reaction tank, and the branch has an enlarged part having the first diameter; and
   mounting a video bubble detector on the enlarged part of the branch for detecting the bubble existing in the plating solution flowing through the branch.

7. The method of claim 6, further providing a flow controller on the tube for controlling flow rate of the plating solution flowing through the tube.

8. The method of claim 6, further providing a return tank receiving the plating solution overflowing from the reaction tank and returning from the branch.

9. The method of claim 6, wherein the video bubble detector comprises a charge coupled device (CCD).

10. A method of claim 6, further performing a copper electroplating process for a semiconductor device.

11. The method of claim 6, further providing a yellow light source for the video bubble detector.

* * * * *